(12) United States Patent
Nakano

(10) Patent No.: US 6,473,722 B1
(45) Date of Patent: Oct. 29, 2002

(54) COMPACT FAULT DETECTING SYSTEM CAPABLE OF DETECTING FAULT WITHOUT OMISSION

(75) Inventor: Hirotaka Nakano, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/215,701

(22) Filed: Dec. 18, 1998

(51) Int. Cl.$^7$ ................................................ G06F 11/30
(52) U.S. Cl. ............................ 702/185; 702/58; 377/28
(58) Field of Search ........................... 702/57, 58, 59, 702/185; 324/500, 512, 513; 714/25, 803, 804, 805, 128; 377/28

(56) References Cited

U.S. PATENT DOCUMENTS

| | | | | |
|---|---|---|---|---|
| 3,555,255 A | * | 1/1971 | Toy et al. | 714/801 |
| 3,831,148 A | * | 8/1974 | Greenwald et al. | 714/31 |
| 5,440,604 A | * | 8/1995 | De Subijana et al. | 377/28 |
| 5,448,722 A | * | 9/1995 | Lynne et al. | 706/49 |
| 5,574,856 A | * | 11/1996 | Morgan et al. | 714/52 |
| 5,627,965 A | * | 5/1997 | Liddell et al. | 714/48 |

FOREIGN PATENT DOCUMENTS

| | | |
|---|---|---|
| JP | 58-169253 | 10/1983 |
| JP | 63-126041 | 5/1988 |
| JP | 4-98555 | 3/1992 |

OTHER PUBLICATIONS

John Markus, "Sourcebook of electronic circuits", 1968, p. 152.*

* cited by examiner

*Primary Examiner*—Marc S. Hoff
*Assistant Examiner*—Mohamed Charioui
(74) *Attorney, Agent, or Firm*—Dickstein, Shapiro, Morin & Oshinsky, L.L.P.

(57) ABSTRACT

A fault detection system applies known data to the input of a circuit being inspected for faults and examines the circuit output for expected results. Faults in a circuit are detected by receiving unexpected results at the circuit output. A fault detection circuit provides a fault signal that is enabled only when a reset line is activated. Activation of the reset line also prompts the known data to be applied to the circuit input. The known data can be derived from memory storage units that provide a known output upon activation of the reset signal. Accordingly, the system does not require parity bits or excessive hardware to provide fault detection for almost all modes of failure in a given circuit.

9 Claims, 4 Drawing Sheets

COMPACT FAULT DETECTING SYSTEM CAPABLE OF DETECTING FAULT WITHOUT OMISSION

BACKGROUND OF THE INVENTION

This invention relates to a fault detecting system, particularly to the fault detecting system for use in an apparatus having a storing unit that is reset to a certain value at the time of initialization.

Conventionally, fault detection has been carried out for various kinds of apparatus such as an extended adapter board mounted on a personal computer. Some fault detections are carried out by constantly monitoring the apparatus through a parity check or a duplicated circuit. Other fault detections are carried out by judging whether or not a response is sent, for example, from the extended adaptor board at the time of starting up the personal computer.

An example of a method of the fault detection using the above-mentioned parity check is exemplified, as a first prior art, in unexamined Japanese Patent Publication No. Sho 58-169253, namely 169253/1983. In the first prior art, a parity bit is added to data so that the number of ones ("on" bits) within a group of data may become an even number (even parity check) or an odd number (odd parity check). The parity bit and the data are stored together in a storage unit. The fault detection is carried out by checking whether or not the number of ones is even or odd when the parity bit and the data are read from the storing unit. However, a method used in the first prior art requires not only a hardware unit for storing the parity bit but also a hardware unit for checking whether or not the number of ones indicate a predetermined even or odd parity. As a result, the hardware of the fault detection system in the first prior art inevitably becomes large in size or complex.

Furthermore, an example of a method of the fault detection using the above-mentioned duplicated circuit is disclosed, as a second prior art, in unexamined Japanese Patent Publication No. Sho 63-126041, namely, 126041/1988. In the second prior art, the fault detection system has a couple of circuits, each having the same function. Fault detection is carried out by checking if the outputs of the circuits is the same when the same input is applied. However, a method used in the second prior art requires twice the circuitry as that of a circuit for achieving the function alone.

Moreover, another example of a method of fault detection carried out by judging whether or not a response is sent from the extended adaptor board at the time of starting up the personal computer is disclosed, as a third prior art, in unexamined Japanese Patent Publication No. Hei 4-98555, namely 98555/1992. In the third prior art, a signal or a command for expecting a specific response is produced from a main board at the time of starting up the personal computer. Accordingly, the fault detection is carried out by checking whether or not the expected response is returned from the extended adaptor board. By a method used in the third prior art, it is possible to detect a fault of a function from the response in the extended adaptor board. However, it is not possible to detect faults for another function having no relation to the response for the original in the extended adaptor board.

Thus, the methods of the first and the second prior arts of always detecting faults through a parity check or a duplicated circuit are superior in detection accuracy to the method of the third prior art. However, the hardware used for detecting faults inevitably become large in size and adds complexity. A problem of increased cost is incurred to put the methods of the first and the second prior arts into practice.

On the other hand, in the method of the third prior art of judging whether or not a proper response is returned from the extended adaptor board, the fault detection system is realized with comparatively simple hardware. However, it is only possible to detect a fault for the circuit capable of returning the response. Accordingly, it is difficult to detect all the faults generated in an entire apparatus.

SUMMARY OF THE INVENTION

It is therefore an object of the present invention to provide a compact fault detection system which is capable of detecting almost all faults generated in an entire apparatus.

Other objects of the present invention will become clear as the description proceeds.

According to an aspect of the present invention, there is provided a fault detection system for use in an apparatus, comprising: storing means which store data and which are reset to have a predetermined value when the apparatus is initialized; an objective circuit which is supplied with the data stored in the storing means as input data and which produces an output; and fault detection means for detecting whether or not the output is corresponding to the predetermined value when the storing means are reset; the fault detection means deciding that the objective circuit has a fault when the output is not corresponding to the predetermined value.

The fault detection means may not detect whether or not the output is corresponding to the predetermined value when the storing means are not reset.

The objective circuit may be an operator which outputs specific data univocally determined by input data inputted thereinto.

The objective circuit may be a combinational circuit which outputs specific data univocally determined by input data inputted thereinto.

According to another aspect of the present invention, there is provided a fault detection system for use in an apparatus, comprising: storing means which store data and which are reset to have a predetermined value when the apparatus is initialized; a plurality of objective circuits which are suppled with the data stored in the storing means as input data and which produce outputs, respectively; and fault detection means for detecting whether or not the outputs are corresponding to the predetermined value, respectively when the storing means are reset; the fault detection means deciding that the plurality of objective circuits have a fault when any one of the outputs is not corresponding to the predetermined value.

The fault detection mans may not detect whether or not the outputs are corresponding to the predetermined value, respectively when the storing means are not reset.

One of a plurality of the objective circuits may be an operator which outputs specific data univocally determined by input data inputted thereinto.

One of a plurality of the objective circuits may be a combinational circuit which outputs specific data univocally determined by input data inputted thereinto.

DETAILED DESCRIPTION OF THE PREFERRED EMBODIMENTS

Figure 1:
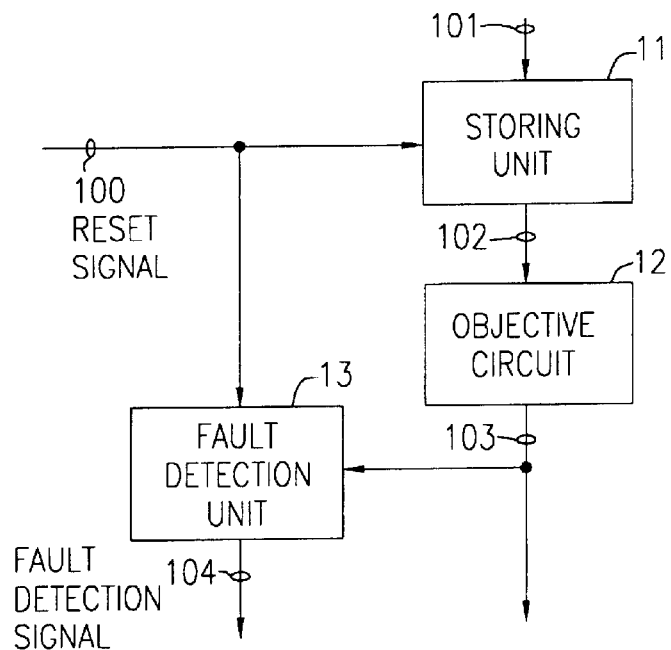
FIG. 1 is a block diagram for showing a fault detection system according to a first embodiment of the present invention.
Figure 2:
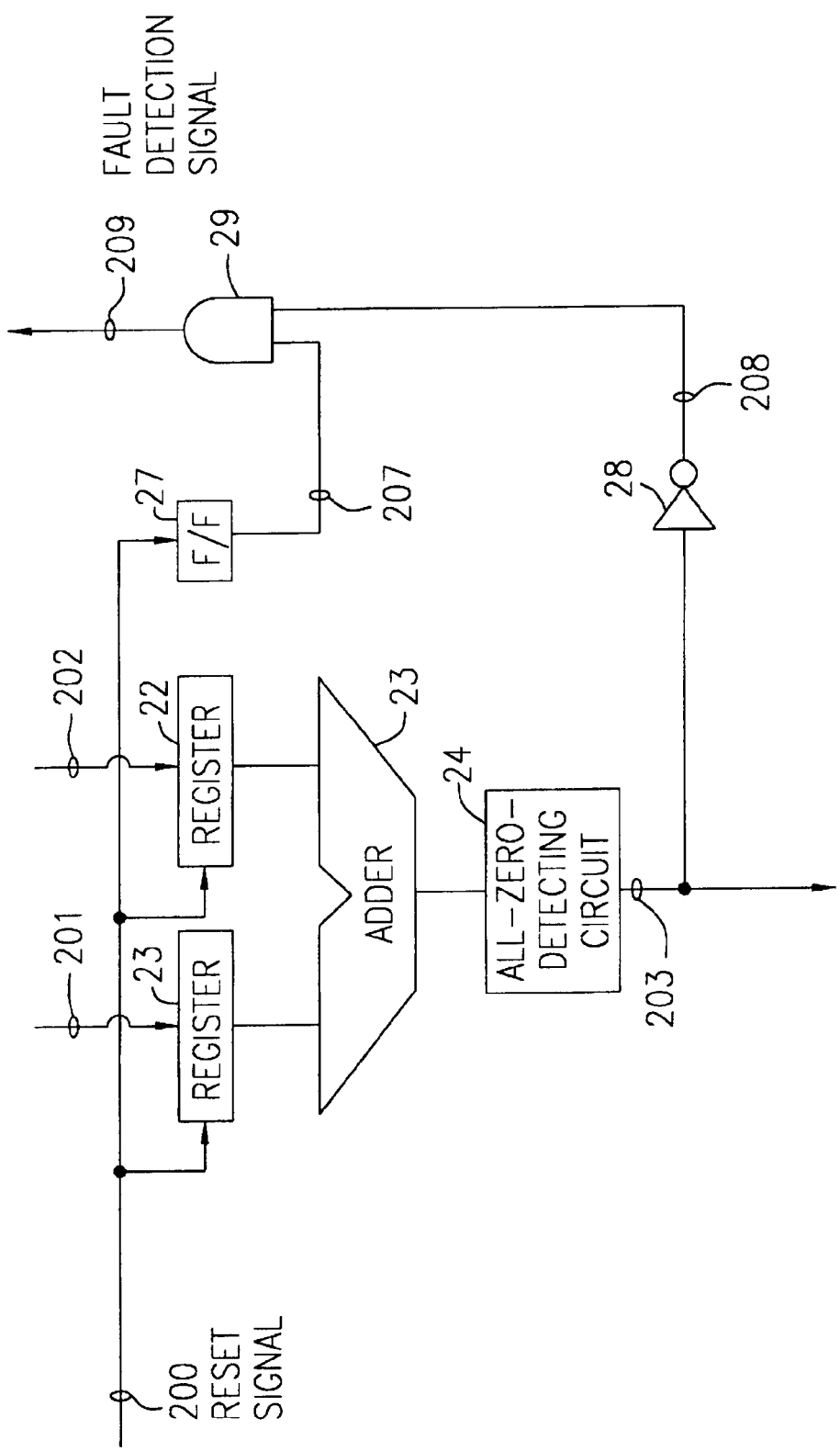
FIG. 2 is a circuit diagram for showing an example 1 of the fault detection system illustrated in FIG. 1.
Figure 3:
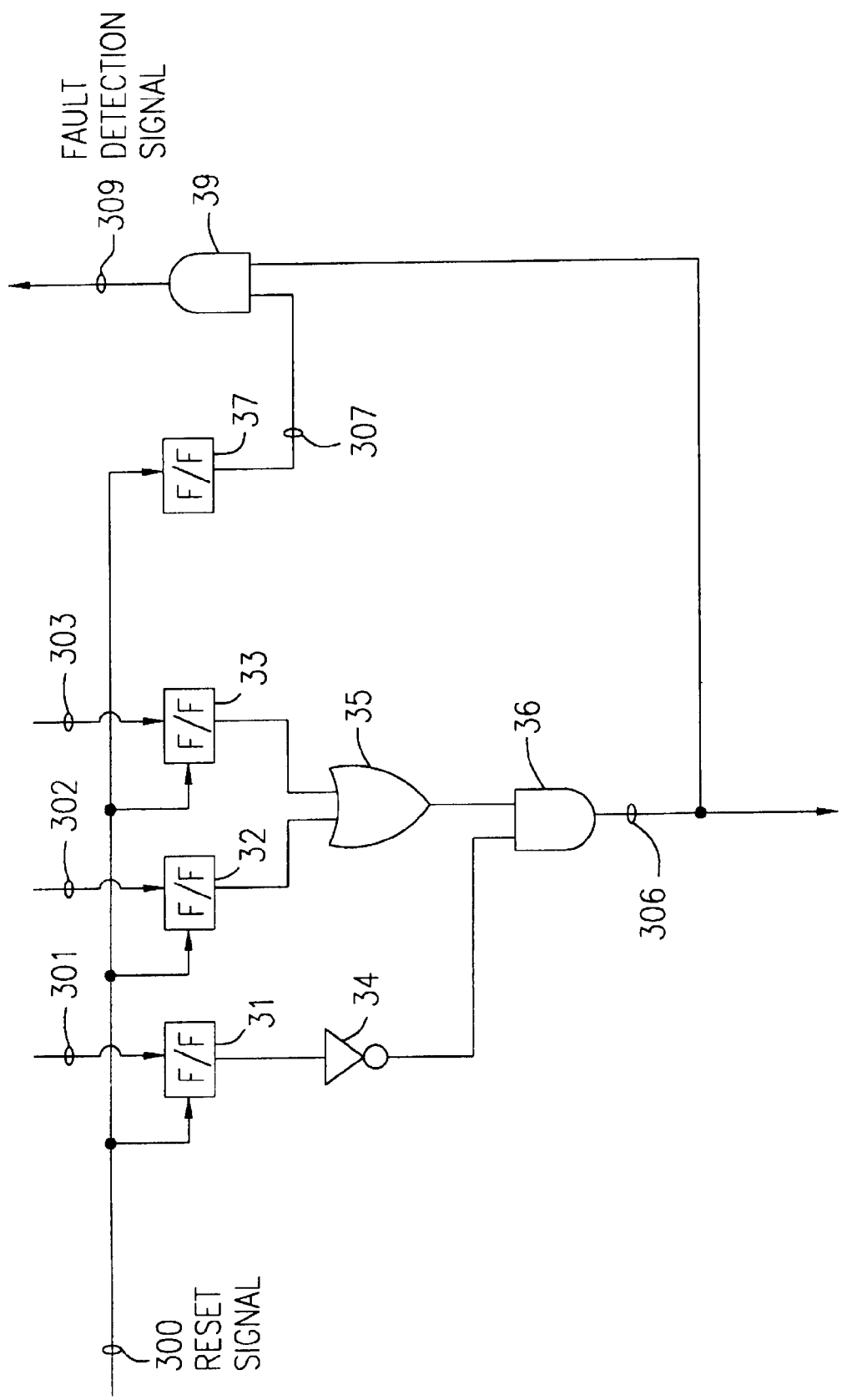
FIG. 3 is a circuit diagram for showing an example 2 of the fault detection system illustrated in FIG. 1.

Referring now to FIGS. 1 through 3, description will proceed to a fault detection system according to a first embodiment of the present invention. FIG. 1 is a schematic block diagram of the fault detection system according to the first embodiment.

As illustrated in FIG. 1, the fault detection system according to this embodiment comprises a storing unit 11 which stores input data from a signal 101 and which is reset by a reset signal 100, an objective circuit (a circuit which is subjected to a fault detection) 12 which produces a signal 103 in response to a signal 102 that outputs the data stored in the storing unit 11, and a fault detection unit 13 which inspects a value of the signal 103 to detect whether or not the objective circuit 12 has a fault when the storing unit 11 is reset by the reset signal 100.

During a normal operation, the storing unit 11 stores data received by the signal 101 and outputs the data by the signal 102. In response to the data received by the signal 102, the objective circuit 12 carries out various arithmatic operations to output the signal 103. The fault detection unit 13 never carries out a fault detection during the normal operation.

On the other hand, if the reset signal 100 is produced at the time of initialization, a content of data stored in the storing unit 11 is reset (initialized). The storing unit 11 outputs initial data by the signal 102. The objective circuit 12 carries out an arithmatic operation in response to the initial data received as input data to output the signal 103. Accordingly, in a case that the objective circuit 12 has no fault, the signal 103 outputted therefrom shows a predetermined value. When the reset signal 100 is produced as mentioned above, the fault detection unit 13 inspects whether or not the signal 103 outputted from the objective circuit 12 shows the predetermined value. The fault detection unit 13 produces a fault detection signal 104 in a case that the signal 103 does not show the predetermined value.

Referring now to FIGS. 2 and 3, examples of the fault detection system according to the first embodiment are shown.

EXAMPLE 1

As illustrated in FIG. 2, a fault detection system of the example 1 comprises a register 21 which stores input data from a signal 201 and which is reset by a reset signal 200, a register 22 which stores input data from a signal 202 and which is reset by the reset signal 200, an adder 23 which adds the data stored in the register 21 and the register 22 to each other, an all-zero-detecting circuit 24 which decides whether or not a result of the adding operation by the adder 23 is zero, a flip-flop (F/F) 27 which buffer a state of the reset signal 200, an inverter 28 which logically reverses a signal 203 outputted from the all-zero-detecting circuit 24, and an AND gate 29 which provides an AND function between a signal 207 outputted from the flip-flop 27 and a signal 208 outputted from the inverter 28 to produce a fault detection signal 209. In the structure being illustrated, the storing unit 11 illustrated in FIG. 1 is composed of the registers 21 and 22. The objective circuit (a circuit which is subjected to a fault detection) 12 is composed of the adder 23 and the all-zero-detecting circuit 24. The fault detection unit 13 is composed of the flip-flop 27, the inverter 28 and the AND gate 29.

During a normal operation, data received from the signals 201 and 202 are set on the registers 21 and 22, respectively. The data then become input data to the adder 23. The result of the adding operation by the adder 23 is inputted to the all-zero-detecting circuit 24. The all-zero-detecting circuit 24 decides whether or not the result of the adding operation by the adder 23 is zero. Accordingly, the signal 203 become a logic 1 in a case that the result of the adding operation is zero. On the contrary, the signal 203 becomes a logic 0 in a case that the result of the adding operation is not zero. The signal 203 is used as input data or a control signal by the other circuits (not shown). The flip-flop 27 keeps a logic level 0 during the normal operation. The fault detection signal 209 never becomes a logic 1.

On the other hand, if the reset signal 200 is produced, the registers 21 and 22 are cleared (initialized) to 0. Both the data outputted from the registers 21 and 22 and inputted to the adder 23 becomes 0. Accordingly, in a case that the adder 23 and the all-zero-detecting circuit 24 show a fault, the result of arithmatic operation in the all-zero-detecting circuit 24 through the adder 23 (which corresponds the signal 203) always becomes a logic 1. The flip-flop 27 keeps a logic level 1 when the reset signal 200 is produced while a logic level 0 during the normal operation. The signal 203 is logically reversed by the inverter 28 to be inputted to the AND gate 29 as the signal 208. Thus, if the signal 203 is a logic 0 at the time of producing the reset signal 200, the adder 23 and the all-zero-detecting circuit 24 show a fault. In such a case, the fault detection signal 209 becomes a logic 1 to show the fault existing in the adder 23 or the all-zero-detecting circuit 24.

Referring to FIG. 3, example 2 of the fault detection system according to the first embodiment is shown.

EXAMPLE 2

As illustrated in FIG. 3, a fault detection system of the example 2 comprises a flip-flop 31 which stores input data from a signal 301 and which is reset by a reset signal 300, a flip-flop 32 which stores input data from a signal 302 and which is reset by a reset signal 300, a flip-flop 33 which stores input data from a signal 303 and which is reset by a reset signal 300, an inverter 34 which logically reverses the data stored in the flip-flop 31, an OR gate 35 which provides an OR function between the data stored in the flip-flop 32 and the flip-flop 33, an AND gate 36 which provides an AND function between an output from the inverter 34 and an output from the OR gate 35, a flip-flop 37 which buffers a state of the reset signal 300, and an AND gate 39 which provides an AND function between a signal 307 outputted from the flip-flop 37 and a signal 306 outputted from the AND gate 36 to produce a fault detection signal 309. In the structure being illustrated, the storing unit 11 illustrated in FIG. 1 is composed of the flip-flop 31, the flip-flop 32 and the flip-flop 33. The objective circuit (a circuit which is subjected to a fault detection) 12 is composed of the inverter 34, the OR gate 35 and the AND gate 36. The fault detection unit 13 is composed of the flip-flop 37 and the AND gate 39.

During a normal operation, data received from the signals 301, 302 and 303 are set on the flip-flops 31, 32 and 33, respectively. The data thus stored in the flip-flops 31, 32 and 33 then determine a signal 306 outputted from a duplicated circuit which is composed of the inverter 34, the OR gate 35 and the AND gate 36. The signal 306 is used as input data or a control signal by the other circuits (not shown). The flip-flop 37 keeps a logic level 0 during the normal operation. The fault detection signal 309 never becomes a logic 1.

On the other hand, if the reset signal 300 is produced, the flip-flops 31, 32 and 33 are cleared (initialized) to 0. Therefore, the signal 306 outputted from the duplicated circuit composed of the inverter 34, the OR gate 35 and the AND gate 36 always becomes a logic 0 when the objective circuit (the inverter 34, the OR gate 35 and the AND gate 36) has no fault. The flip-flop 37 keeps a logic level 1 when the reset signal 300 is produced while a logic level 0 during the normal operation. The signal 306 is inputted to the AND gate 39. Thus, if the signal 306 is a logic 1 at the time of producing the reset signal 300, the objective circuit (the inverter 34, the OR gate 35 and the AND gate 36) shows a fault. In such a case, the fault detection signal 309 becomes a logic 1 to show the fault existing in the objective circuit (the inverter 34, the OR gate 35 and the AND gate 36).

Figure 4:
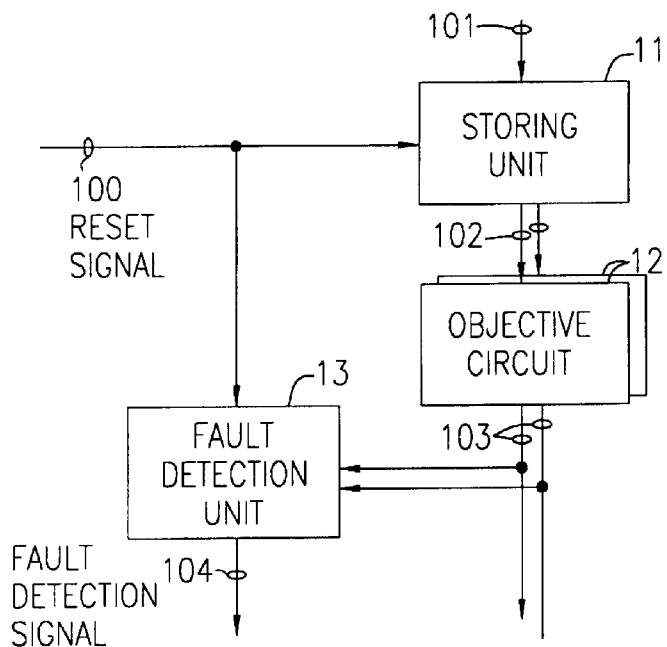
FIG. 4 is a block diagram for showing a fault detection system according to a second embodiment of the present invention.
Figure 5:
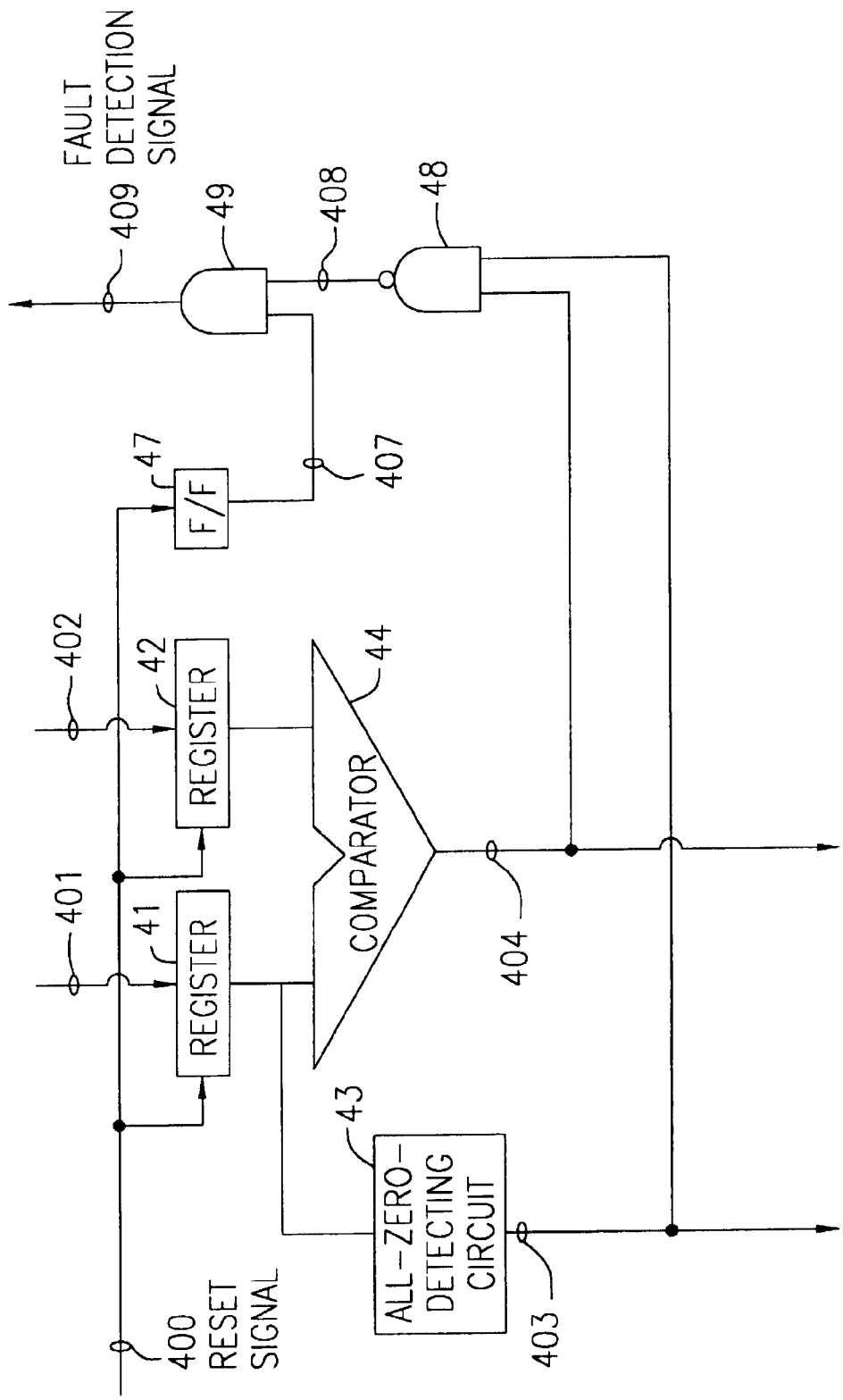
FIG. 5 is a circuit diagram for showing an example 3 of the fault detection system illustrated in FIG. 4.

Referring now to FIGS. 4 and 5, a fault detection system according to a second embodiment of the present invention is shown. FIG. 4 is a schematic block diagram of the fault detection system according to the second embodiment.

As illustrated in FIG. 4, the fault detection system according to this embodiment has a structure similar to that of the first embodiment except that a plurality of objective circuits (circuits which are subjected to a fault detection) 12 each of which produces a signal 103 in response to each signal 102 that outputs the data stored in the storing unit 11 are provided. Similar portions are designated by like reference numerals and a detailed description thereof is omitted accordingly.

As will be understood from FIG. 4, an operation of the fault detection system according to the second embodiment is similar to that of the first embodiment.

Referring to FIG. 5, an example 3 of the fault detection system according to the second embodiment is shown.

EXAMPLE 3

As illustrated in FIG. 5, a fault detection system of the example 3 comprises a register 41 which stores input data from a signal 401 and which is reset by a reset signal 400, a register 42 which stores input data from a signal 402 and which is reset by the reset signal 400, an all-zero-detecting circuit 43 which decides whether or not the data from the register 41 is zero, a comparator 44 which compares the data stored in the registers 41 and 42 with each other to decide whether or not the data are corresponding to each other, a flip-flop (F/F) 47 which buffer a state of the reset signal 400, a NAND gate 48 which logically reverses the AND between a signal 403 outputted from the all-zero-detecting circuit 43 and a signal 404 outputted from the comparator 44, and an AND gate 49 which provides an AND function between a signal 407 outputted from the flip-flop 47 and a signal 408 outputted from the NAND gate 48 to produce a fault detection signal 409. In the structure being illustrated, the storing unit 11 illustrated in FIG. 4 is composed of the registers 41 and 42. Each of the objective circuits (circuits which are subjected to a fault detection) 12 is composed of the all-zero-detecting circuit 43 and the comparator 44. The fault detection unit 13 is composed of the flip-flop 47, the NAND gate 48 and the AND gate 49.

During a normal operation, data received from the signals 401 and 402 are set on the registers 41 and 42, respectively. The all-zero-detecting circuit 43 decides whether or not the data stored in the register 41 is zero. Accordingly, the signal 403 become a logic 1 in a case that the data is decided to be zero. On the contrary, the signal 403 becomes a logic 0 when the data is determined to be non-zero. The comparator 44 compares the data stored in the registers 41 and 42 with each other to decide whether or not the data are corresponding to each other. As a result, the signal 404 becomes a logic 1 in a case that the data are corresponding to each other. On the contrary, the signal 404 becomes a logic 0 in a case that the data are not corresponding to each other. The signals 403 and 404 are used as input data or control signals by the other circuits (not shown). The flip-flop 47 keeps a logic level 0 during the normal operation. The fault detection signal 409 never becomes a logic 1.

On the other hand, if the reset signal 400 is produced, the registers 41 and 42 are cleared (initialized) to 0. All the data inputted to the all-zero-detecting circuit 43 and the comparator 44 become 0. Accordingly, in a case that each of the objective circuits (the all-zero-detecting circuit 43 and the comparator 44) has no fault, the signal 403 outputted from the all-zero-detecting circuit 43 always becomes a logic 1. Further, the signal 404 outputted from the comparator 44 also becomes a logic 1. The flip-flop 47 keeps a logic level 1 when the reset signal 400 is produced while a logic level 0 during the normal operation. The signals 403 and 404 are inputted to the NAND gate 48. Only when both the signals 403 and 404 are logic 1, the signal 408 is outputted from the NAND gate 48 is a logic 0. The signal 408 is inputted to the AND gate 49. Thus, if the signal 403 or the signal 404 is a logic 0 at the time of producing the reset signal 400, one or more of the objective circuits (the all-zero-detecting circuit 43 and the comparator 44) shows a fault. In such a case, the signal 408 outputted from the NAND gate 48 becomes a logic 1. Further, the fault detection signal 409 becomes a logic 1 to show the fault existing in one or more of the objective circuits (the all-zero-detecting circuit 43 and the comparator 44). In the second embodiment, a fault detection can be carried out by simple hardwares, even if a plurality of objective circuits (circuits which are subjected to a fault detection) are provided.

As mentioned above, the fault detection systems according to the first and the second embodiments of the present invention utilize the event in which the data are fixed to a predetermined value by the reset. It therefore becomes unnecessary that specific information such as the parity bit in a parity check is stored in any hardware. Accordingly, a fault detection system is realized by simple or compact hardware.

Further, in the fault detection system according to the first and the second embodiments of the present invention, all the circuits to which the data stored in the storing unit are inputted can be subjected to fault detection. Further, even if the data stored in the storing unit are indirectly inputted to an objective circuit through another circuit to which the data are directly inputted, the objective circuit can be subjected to fault detection. Moreover, it can be checked whether or not the storing unit is initialized by the reset. Accordingly, the fault detection system can detect almost all of the faults generated in an entire apparatus. In other words, the fault detection system can detect the faults without omission.

While the present invention has thus far been described in conjunction with only several embodiments thereof, it will now be readily possible for one skilled in the art to put the present invention into effect in various other manners.

What is claimed is:

1. A fault detection system for detecting faults in a circuit, said fault detection system comprising:

a data storage element having a storage output;

a reset signal coupled to said storage element;

said storage element effective to apply a fault detection data value to said storage output when said reset signal is active;

said storage output coupled to a circuit input of said circuit;

a circuit output of said circuit providing an output signal related to said circuit input; and a fault detector coupled to said circuit output, said fault detector operable to determine whether said circuit output includes a fault based on said circuit input when said fault detection data value is applied to said storage output.

2. A fault detection system according to claim 1, wherein said reset signal is coupled to said fault detector.

3. A fault detection system according to claim 2, wherein said reset signal enables said fault detector when said reset signal is active.

4. A fault detection system according to claim 2, further comprising:

a buffer element in said fault detector, said buffer element having a buffer output;

said buffer element holds a value of said reset signal when said reset signal is active; and said buffer output enables a fault detector output.

5. A fault detection system according to claim 1, wherein said circuit output is univocally determined by said input.

6. A fault detection system according to claim 1, wherein said data storage element comprises a plurality of data storage elements, each of said data storage elements having a storage output coupled to a respective circuit input of said circuit.

7. A fault detection system according to claim 1, wherein said circuit comprises a plurality of circuits, each of said circuits having a circuit input and a circuit output, said storage output coupled to said circuit inputs, and said circuit outputs coupled to said fault detector.

8. A method of detecting a fault in a circuit, said method comprising:

activating a reset signal;

applying a fault detection data value to said circuit when a reset signal is active;

analyzing a circuit output of said circuit to detect a fault based on an expected value of said circuit output resulting from application of said fault detection data value; and enunciating detected faults.

9. A method of detecting a fault according to claim 8, further comprising enabling fault detection by activation of said reset signal.

* * * * *